United States Patent [19]
Matsui et al.

[11] Patent Number: 5,530,827
[45] Date of Patent: Jun. 25, 1996

[54] DATA MANAGEMENT SYSTEM FOR PROGRAMMING-LIMITED TYPE SEMICONDUCTOR MEMORY AND IC MEMORY CARD EMPLOYING DATA SAVE/ERASE PROCESS WITH FLAG ASSIGNMENT

[75] Inventors: Noriyuki Matsui; Hiroyuki Itoh, both of Kawasaki, Japan

[73] Assignee: Fujitsu Limited, Kanagawa, Japan

[21] Appl. No.: 980,089

[22] Filed: Nov. 24, 1992

[30] Foreign Application Priority Data

Nov. 28, 1991 [JP] Japan ..................................... 3-314467

[51] Int. Cl.⁶ .................................................. G06F 12/00
[52] U.S. Cl. ................... 395/430; 395/184.01; 395/442; 395/492; 364/965.76; 364/DIG. 1; 364/DIG. 2; 364/281
[58] Field of Search ............................ 364/200 MS File, 364/900 MS File; 365/185 T, 218; 395/400, 425, 575, 430, 184.01, 442, 492

[56] References Cited

U.S. PATENT DOCUMENTS

| | | | |
|---|---|---|---|
| 4,758,988 | 7/1988 | Kuo et al. | 365/185.09 |
| 5,148,481 | 9/1992 | Abraham et al. | 380/46 |
| 5,206,944 | 4/1993 | Pilkenton | 395/405 |
| 5,249,158 | 9/1993 | Kynett et al. | 365/230.03 |
| 5,295,255 | 3/1994 | Malecek et al. | 395/401 |

FOREIGN PATENT DOCUMENTS

| | | |
|---|---|---|
| 0398545A1 | 11/1990 | European Pat. Off. . |
| 0522780A2 | 1/1993 | European Pat. Off. . |
| 59-162695 | 9/1984 | Japan . |
| 62-283496 | 12/1987 | Japan . |
| 2251324 | 7/1992 | United Kingdom . |
| 2251323 | 7/1992 | United Kingdom . |

OTHER PUBLICATIONS

"Trends in Flash Memory System Design", Robinson, IRE Wescon Conference Record, vol. 34, Nov. 1990, pp. 468–472.

Patent Abstracts of Japan, vol. 8, No. 68 (P–264) (1505) Mar. 30, 1984, & JP–A–58 215 794, Dec. 15, 1983.

*Primary Examiner*—Matthew M. Kim
*Attorney, Agent, or Firm*—Nikaido, Marmelstein, Murray & Oram

[57] ABSTRACT

In a data management system for a programming-limited type semiconductor memory which is programmable a limited number of times and which includes a plurality of storage areas, a management unit manages, for each of the storage areas, the number of times that programming has been performed. A control unit selects one of the storage areas for which programming has been performed the smallest number of times and input data is written into the selected one of the storage areas, so that all the storage areas can be equally programmed.

14 Claims, 8 Drawing Sheets

DATA MANAGEMENT SYSTEM FOR PROGRAMMING-LIMITED TYPE SEMICONDUCTOR MEMORY AND IC MEMORY CARD EMPLOYING DATA SAVE/ERASE PROCESS WITH FLAG ASSIGNMENT

BACKGROUND OF THE INVENTION

1. Field of the Invention

The present invention generally relates to programming-limited type semiconductor memories, and more particularly to a data management system for programming-limited type semiconductor memories, such as flash memories having a limited number of times that the programming operation can be repeatedly performed.

2. Description of the Prior Art

Programming-limited type semiconductor memories, such as EPROMs, EEPROMs and flash memories, are widely used. These programming-limited type semiconductor memories have limited numbers of times that the programming operation can be performed. Particularly, flash memories are very attractive in view of the production cost. Normally, the number of times that programming of EPROMs and EEPROMs can be performed is limited to approximately $1 \times 10^5$, and the number of times that programming of flash memories can be performed is limited to approximately $1 \times 10^4$. When the number of times that programming of a programming-limited type semiconductor memory exceeds the allowable number, defective memory cells may occur.

Meanwhile, the number of times that data can be repeatedly written into magnetic hard disks is approximately $1 \times 10^6$. Hence, it is required to increase the number of times that programming of programming-limited type semiconductor memories can be carried out.

SUMMARY OF THE INVENTION

It is an object of the present invention to provide a data management system for programming-limited type semiconductor memories in which programming thereof can be performed more times, so that the lifetime of the memories can be substantially lengthened.

This object of the present invention is achieved by a data management system for a programming-limited type semiconductor memory which is programmable a limited number of times and which includes a plurality of storage areas, the data management system comprising: management means for managing, for each of the storage areas, the number of times that programming has been performed; and control means, coupled to the management means for selecting one of the storage areas for which programming has been performed the smallest number of times and for having input data written into a selected one of the storage areas, so that the storage areas can all be equally programmed.

Another object of the present invention is to provide an IC memory card having the above-mentioned data management system.

This object of the present invention is achieved by an IC memory card comprising: a programming-limited type semiconductor memory which is programmable a limited number of times and which includes a plurality of storage areas; management means for managing, for each of the storage areas, the number of times that programming has been performed; and control means, coupled to the management means for selecting one of the storage areas for which programming has been performed the smallest number of times and for having input data written into a selected one of the storage areas, so that the storage areas can all be equally programmed.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

As has been described previously, when the number of times that programming of a programming-limited type semiconductor memory has been carried out exceeds the allowable number, defective memory cells may occur. For example, some defective memory cells may occur when the number of times that programming of a flash memory has been performed exceeds $1 \times 10^4$. Particularly, when programming of a flash memory has been performed more than $1 \times 10^5$ times, the ratio of defective memory cells to all the memory cells abruptly increases.

With the above in mind, according to the present invention, the entire memory area is divided into a plurality of memory areas, which are used in rotation in order to prevent a particular memory area from being excessively accessed. It will be noted that the term "entire memory area" can be provided by a single memory chip or can be the total of the memory areas of a plurality of chips and that the term "memory areas" can be part of the entire memory area of the single chip or can be provided by a number of chips. According to the present invention, it is possible to lengthen the lifetime of the memory by approximately n times when n chips are used and equally accessed.

Figure 1:
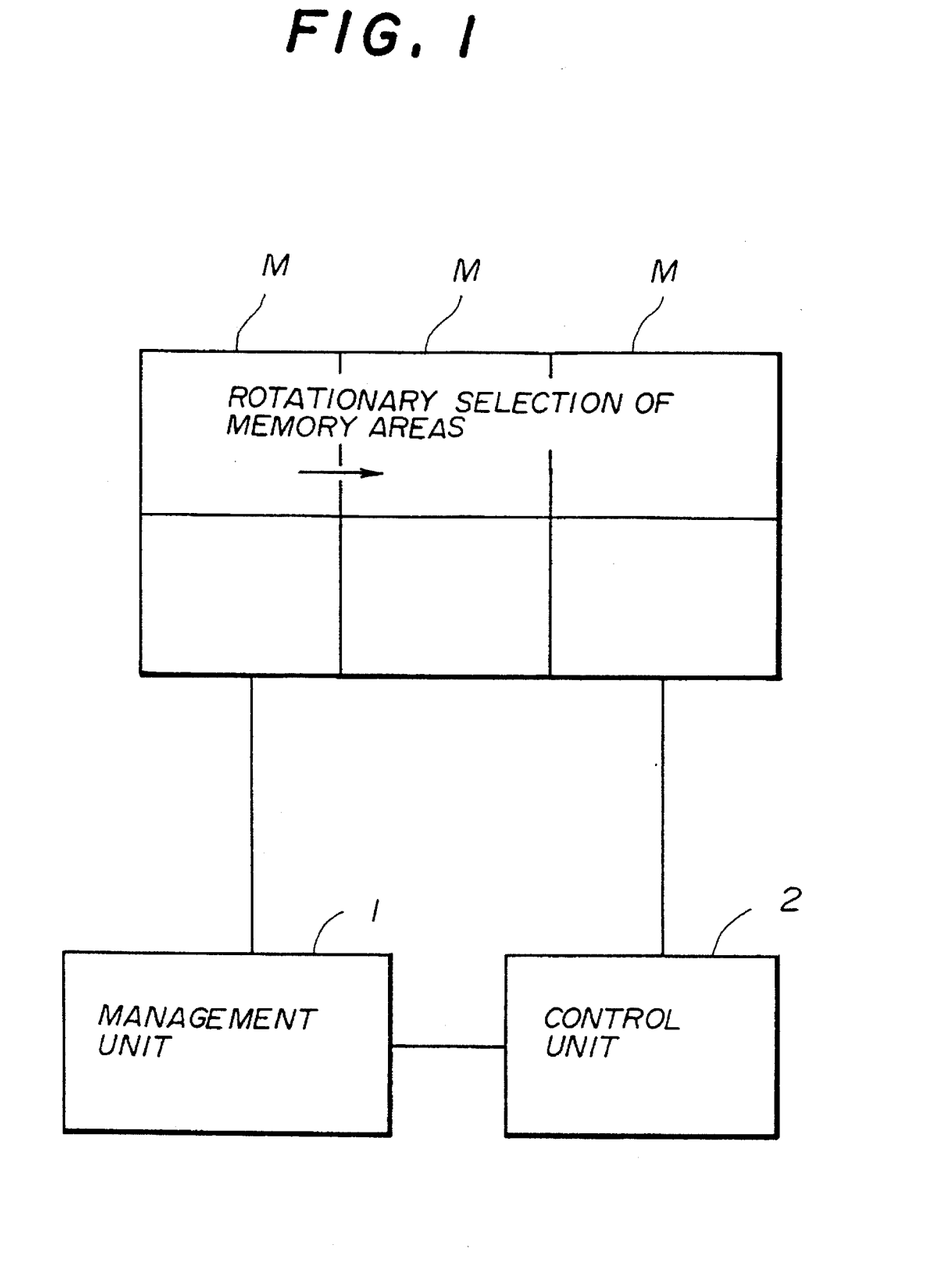
FIG. 1 is a block diagram showing an overview of the present invention.
Figure 2:
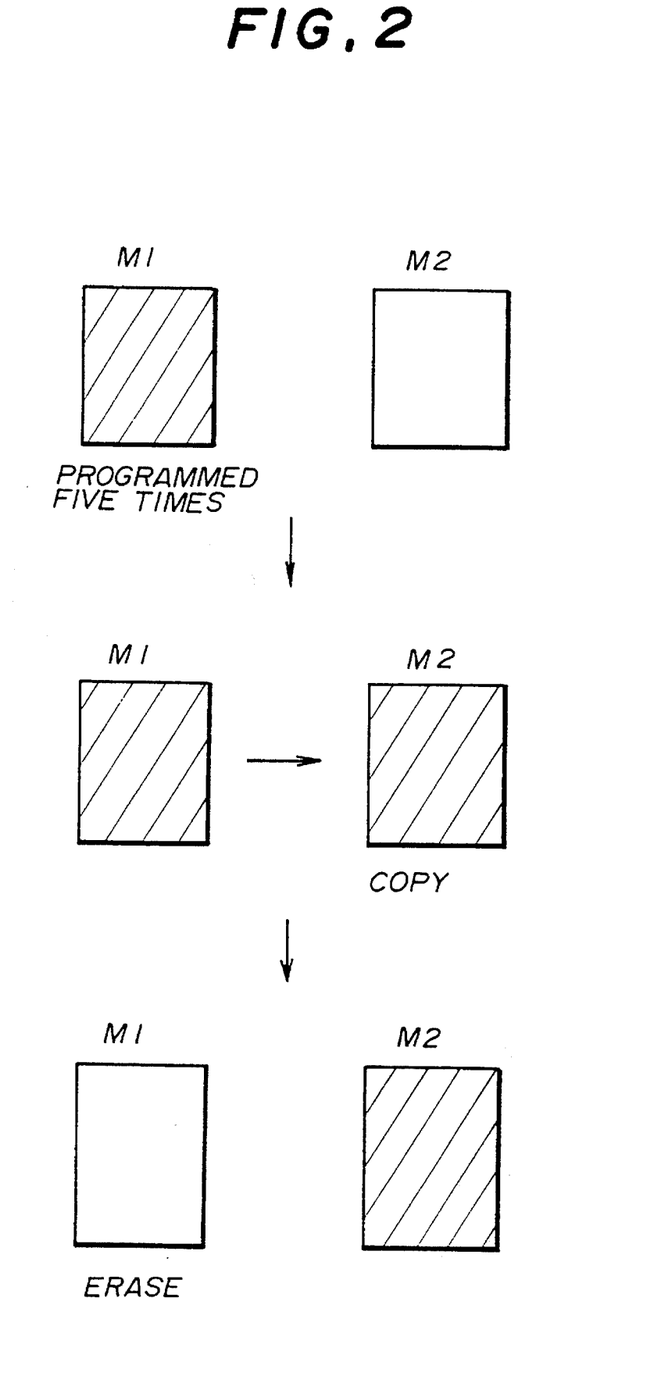
FIG. 2 is a block diagram showing how memory areas are managed according to the present invention.

Referring to FIG. 1, the entire memory area of a programming-limited type semiconductor memory is divided into a plurality of memory areas M. A management unit 1 manages, for each of the memory areas M, the number of times that programming of the area M has been performed. A control unit 2 receives, for each of the memory areas M, information indicating the number of times that programming of the memory area M has been performed, and selects at least one memory area allowed to be programmed from among the memory areas M. In order to select at least one memory area, the control unit 2 compares the numbers of times respectively managed for the memory areas M with one another, and identifies the memory area having the smallest number of times.

In order to facilitate understanding the concept of the present invention, it will now be assumed that there is a programming-limited type semiconductor memory having a first memory area M1 and a second memory area M2 and that particular data exists in the first memory area M1 and no data exists in the second memory area M2. It will be further assumed that a request to update the contents of the first memory area M1 is generated. In this case, according to a conventional method, the address indicating the first memory area, in which the particular data is stored, is identified, and the contents of the first memory area M1 are updated. The above-mentioned updating operation is carried out each time the request is generated. If the request to update the contents of the first memory area M1 is frequently generated and the number of times that programming of the first memory area M1 has been performed exceeds the limit (equal to $1 \times 10^4$ for the flash memories), the entire semiconductor memory can be used no longer even though the second memory area M2 has not been used at all.

On the other hand, according to the present invention, the control unit 2 identifies the memory area (SM) having the smallest number of times that programming has been carried out, and causes data to be written into the memory area SM. It will now be assumed that programming of the first memory area M1 has been performed five times while programming of the second memory area M2 has not been performed. The control unit 2 compares the number of times that programming of the first memory area M1 has been carried out, with the number of times that programming of the second memory area M2 has been carried out. In the case being considered, the number of times related to the second memory area M2 is smaller than the number of times related to the first memory area Mi. Hence, the second memory area M2 is selected as the subject of programming, and the contents of the first memory area M1 are copied therefrom and written into the second memory area M2. Thereafter, the second memory area M2 is used in lieu of the first memory area M1 until the number of times that programming of the second memory area M2 has been performed exceeds the number of times (=5) that programming of the first memory area M1 has been performed. The contents of the first memory area M1 are erased after the copying operation is completed.

It can be seen from the above description that the memory areas can be equally accessed by using the memory areas in rotation so that the memory area having the smallest number of times that programming thereof has been carried out is selected.

It is possible to identify the smallest number of times that programming of the memory area has been carried out each time access for programming is carried out. It is also possible to employ the following alternative process. The control unit 2 compares the largest number of times that programming has been performed with the smallest number of times that programming has been performed, and calculates the difference therebetween. Then, the control unit 2 compares the difference with a threshold value (equal to, for example, 100) and determines whether or not the difference is greater than the threshold value. When the result of the above determination is affirmative, the memory area having the smallest number of times that programming thereof has been carried out is selected and used for programming.

It is possible to detect, for each memory area, how many times data has been erased in lieu of detecting, for each memory area, how many times programming has been performed.

It is necessary to save the contents (files) of the memory area selected for programming in another memory area when the data erasing operation is carried out for each memory area one time. For this purpose, it is possible to provide a specific memory, such as an SRAM or a spare flash memory. Alternatively, it is possible to use a vacant part of the entire memory area in order to save the contents of the storage area selected for programming.

Figure 3:
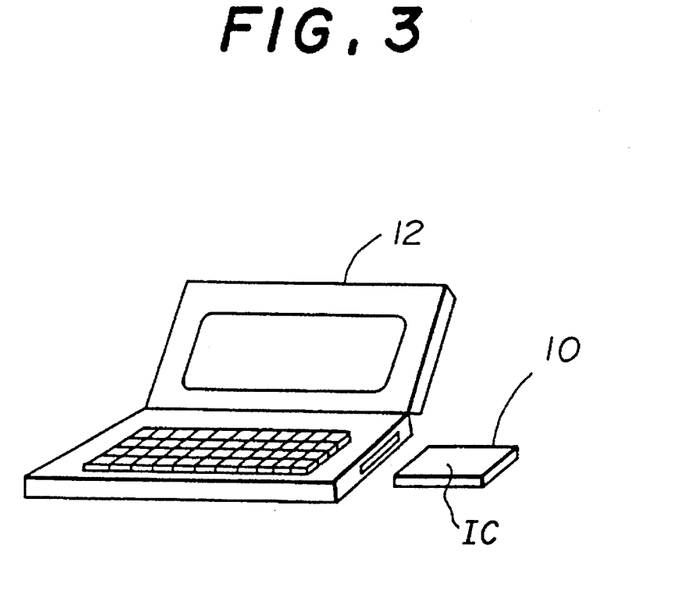
FIG. 3 is a perspective view of a laptop personal computer according to an embodiment of the present invention.

The present invention is suitable for IC memory cards, such as flash memory cards, for use in, for example, laptop personal computers as shown in FIG. 3. In FIG. 3, reference number 10 indicates an IC memory card, and reference number 12 indicates the main body of a laptop personal computer in which the IC memory card 10 is loaded.

Figure 4:
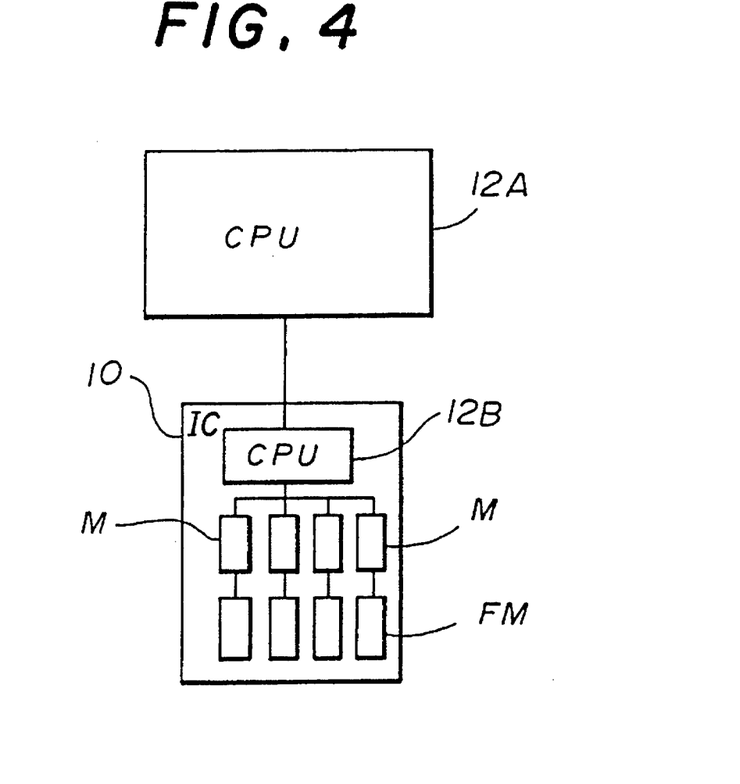
FIG. 4 is a block diagram of the hardware structure of the laptop personal computer shown in FIG. 3.

FIG. 4 is a diagram of the hardware structure of the laptop personal computer shown in FIG. 3. The computer main body 12 includes a CPU 12A, and the IC memory card 10 includes a CPU 12B, memory areas M and a file arrangement memory area FM. The memory areas M may be formed by respective memory chips or a single memory chip. The file arrangement memory area FM may be formed by a single memory chip. It is also possible to form the file arrangement memory area FM in the same chip as the memory areas M. The management unit 1 and the control unit 2 shown in FIG. 1 can be realized by the CPU 12A of the computer main body 12 or the CPU 12B of the IC memory card 10.

Figure 5:
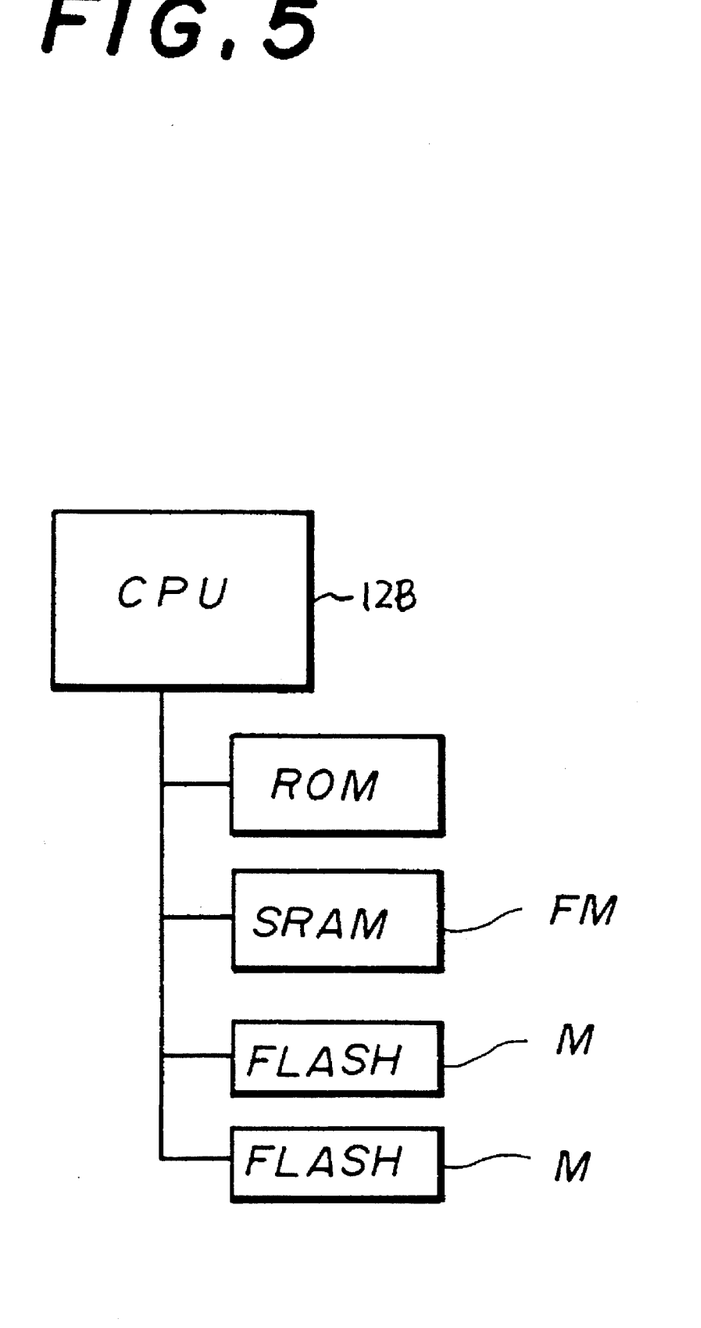
FIG. 5 is a block diagram of another embodiment of the present invention.

The present invention is not limited to the card type memories, and can be applied to a computer system shown in FIG. 5. The computer system shown in FIG. 5 includes a CPU 12B, a ROM, an SRAM and flash memories M. The SRAM functions as the file arrangement memory. The CPU 12B functions as the management unit 1 and the control unit 2, and controls the flash memories.

The information showing how many times programming (or erasing) of the memory area has been carried out can be stored in the memory area itself. Alternatively, it is possible to store the above information in a main memory of the CPU rather than the programming-limited type semiconductor memories. It is preferable to form a management table in the main memory in which the information showing how many times programming (or erasing) of the memory area has been performed is stored for each of the memory areas.

It is possible to further lengthen the lifetime of the programming-limited type semiconductor memories by applying the above-mentioned programming control process together with a continuous data writing process. In the continuous data writing process, input data is written into the vacant memory area following the end of the storage area in which there is valid data. The above writing operation is performed without erasing data stored in other storage areas at the same time as writing of data. In this case, it is preferable to manage the entire storage area for each block having a fixed storage capacity.

Figure 6:
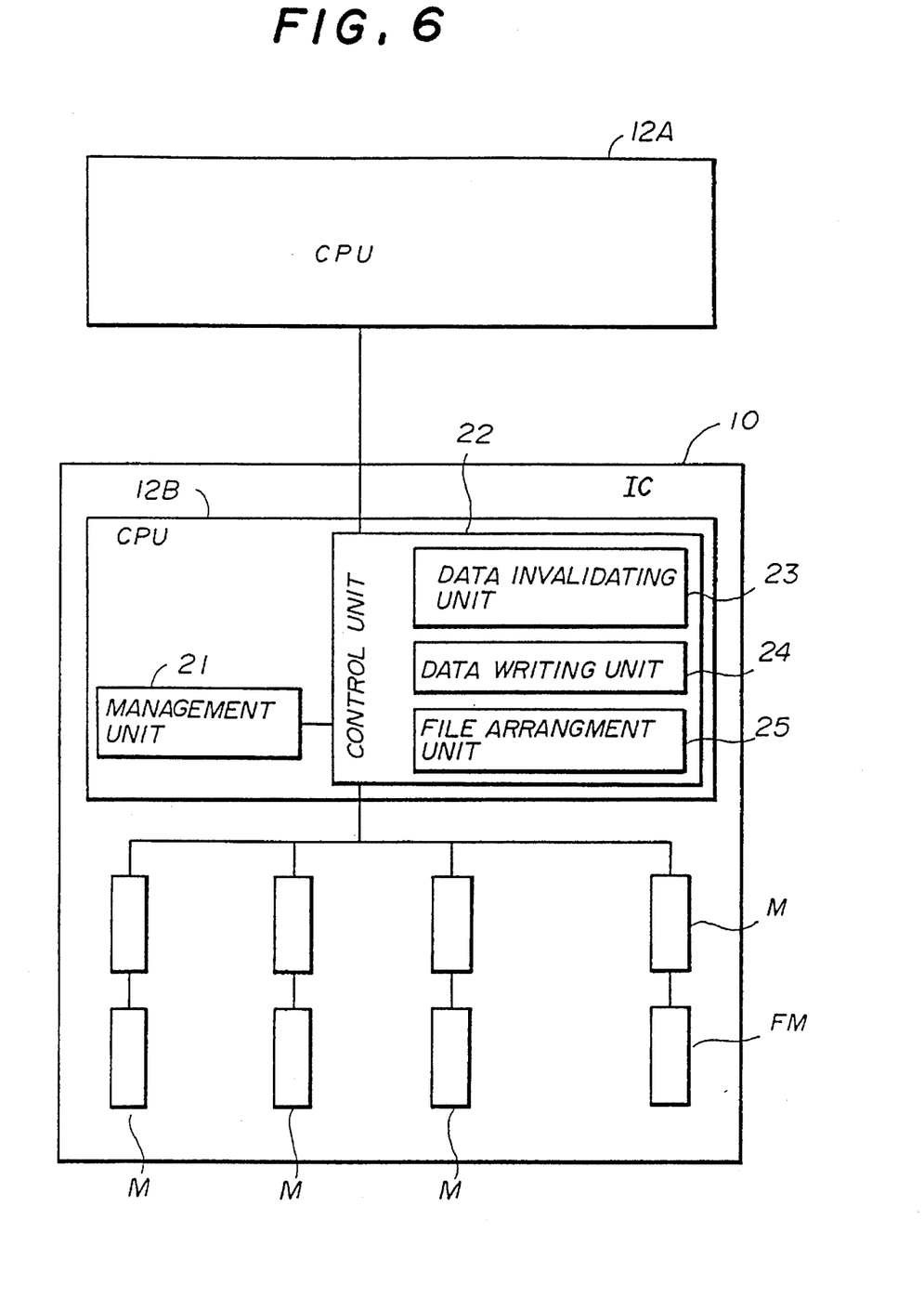
FIG. 6 is a block diagram showing the details of the structure shown in FIG. 4.

FIG. 6 is a block diagram of a system which employs the above-mentioned continuous data writing process. The CPU 12B of the IC memory card 10 comprises a management unit 21 and a control unit 22, which correspond to the management unit 1 and the control unit 2 shown in FIG. 1, respectively. In practice, the management unit 21 and the control unit 22 are realized by means of software executed by the CPU 12B. The control unit 22 comprises a data invalidating unit 23, a data writing unit 24 and a file arrangement unit 25. An erasable data indicating flag is assigned to each piece of data, and indicates whether or not each piece of data is erasable. When there is new data to be written into the IC card memory, the data invalidating unit 23 controls the flag assigned to old data in order to show that the old data is invalid and erasable. It will be noted that in practice invalid and erasable data is not erased at the same time as new data is written. The data writing unit 24 writes data into an idle memory area.

The file arrangement unit 25 manages the memory areas M and the file arrangement area FM. The file arrangement unit 25 selects the memory area having more flags indicating the erasable data than the other memory areas. Then, the file arrangement unit 25 transfers valid data stored in the selected memory area M to the file arrangement memory area FM. Thereafter, the file arrangement unit 25 erases all data itself stored in the selected memory area one time. The management unit 21 is informed of data related to the above erasing operation, and increments, by 1, the count value indicating the number of times that the programming operation has been performed. Thereafter, the rotating process for the memory areas (or chips) is carried out in accordance with information indicating, for each memory area, the number of times that data stored in the memory area has been erased therefrom.

More particularly, the file arrangement unit 25 performs one of first, second and third arrangement processes when the memory area has been filled with data. In the first arrangement process, the file arrangement memory area FM is formed, with a storage element other than the programming-limited type memories. For example, an SRAM is used to form the file arrangement memory area FM. If a file A is rewritten, new data of the file A is written into a vacant storage area, and the above-mentioned flag is assigned to old data of the file A. At this time, the old data of the file A is not erased. When a memory area has been filled with data, the file arrangement unit 25 selects the memory area having the largest number of flags assigned thereto. Then, the file arrangement unit 25 saves valid data stored in the selected memory area in the SRAM serving as the file arrangement memory area FM, and erases all data from the selected memory area. Then, the saved data is written into the original memory area.

In the second arrangement process, a part of the entire memory capacity of the programming-limited semiconductor memory chip (chips), such as a flash memory chip (chips), is used as the file arrangement memory area FM. When the memory area has been filled with data, the file arrangement unit 25 selects the memory area having the largest number of flags with values indicating "erasable" assigned thereto. Then, the file arrangement unit 25 saves valid data stored in the selected memory area in the file arrangement memory area FM which is part of the entire memory capacity of the flash memory chip (chips), and erases all data from the selected memory area. Hence, the selected memory area starts to function as the flag arrangement storage area.

In the third arrangement process, the following rotation of the memory areas (chips) is carried out in order to equally use the memory areas (chips). The third arrangement process will be described in detail later.

Figure 7:
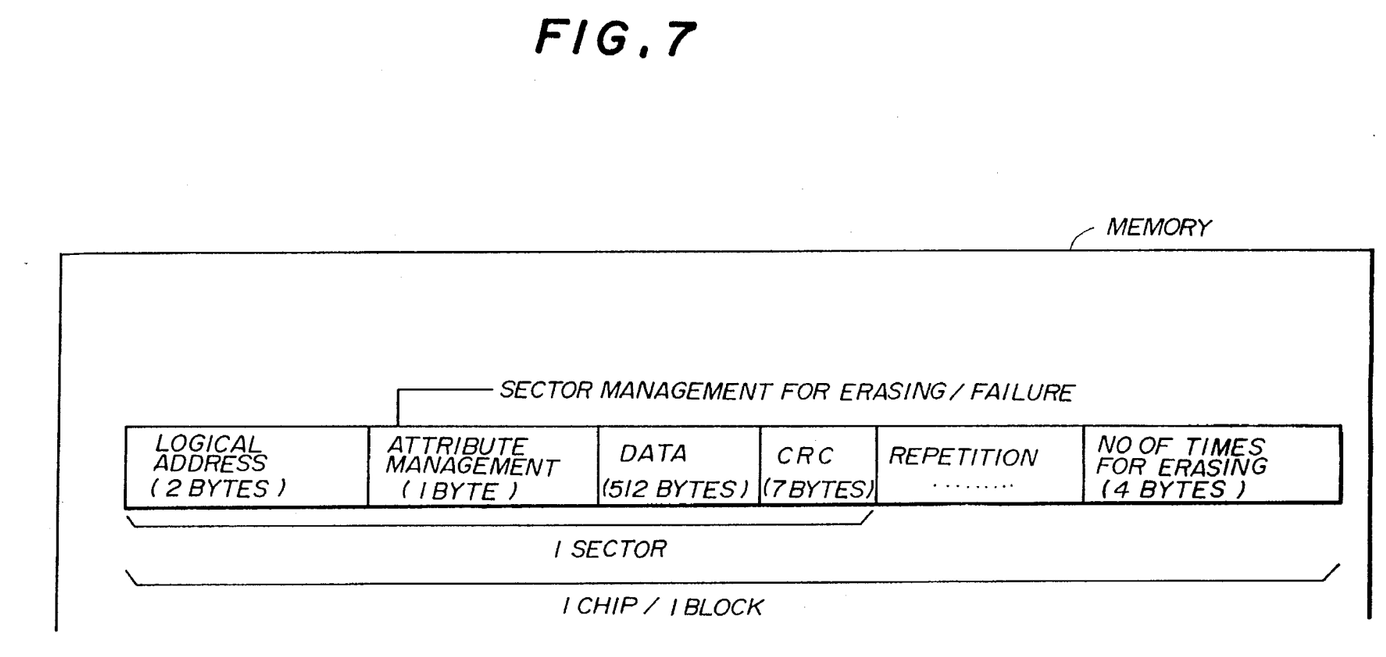
FIG. 7 is a block diagram illustrating the structure of data used in the embodiment of the present invention.

FIG. 7 shows the structure of data handled in the embodiment of the present invention. When a single flash memory chip is used, the entire memory area is divided into a plurality of blocks. When a plurality of flash memory chips are used, each of the flash memory chips forms one block. The data structure is defined for each block, and includes a plurality of sectors. One sector includes a two-byte logical address field, a one-byte attribute management field, a 512-byte data field, and a 7-byte CRC field. The data structure has, at the end thereof, a 4-byte number-of-times information field storing information showing how many times programming of the chip or block has been performed. As has been described previously, the number-of-times information is controlled by the management unit 21. The attribute management field includes information showing whether or not data in the sector being considered is erasable or showing whether or not the sector being considered is defective.

Figure 8:
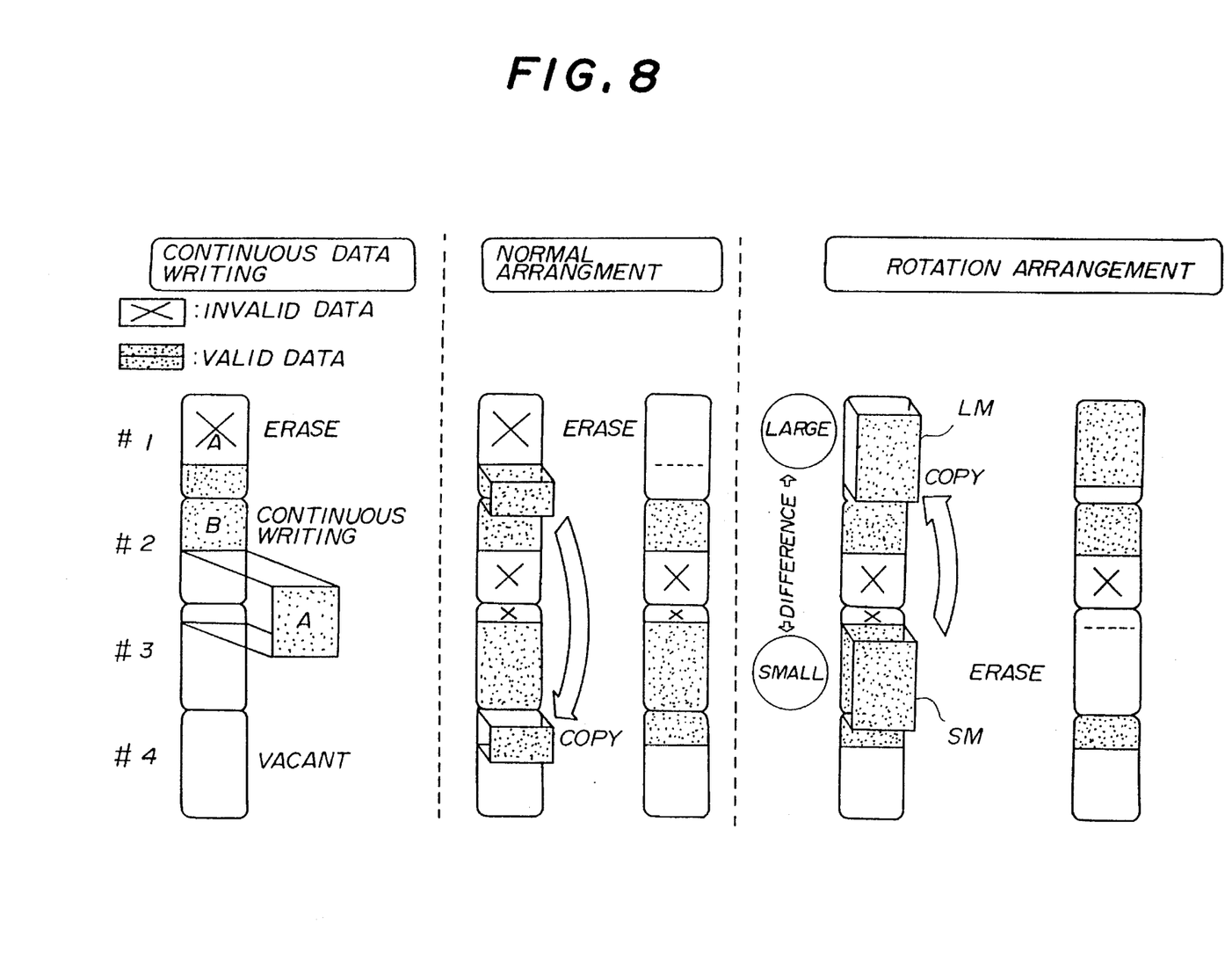
FIG. 8 is a block diagram showing the operation of the embodiment of the present invention.

The operation of the embodiment of the present invention will now be described. It will now be assumed that, as shown in FIG. 8, the IC memory card 10 shown in FIG. 6 has four flash memory chips #1, #2, #3 and #4, and files A and B exist in the IC memory card 10. The CPU 12A (FIG. 6) writes the logical address into the logical address field, and then issues a read or write command. Thereby, consecutive pieces of data equal to one sector (512 bytes) can be transferred.

When the write command is issued, the CPU 12B of the IC memory card 10 compares the logical address stored in the logical address field of the write command with the logical addresses of the storage areas provided by the four flash memories. If the logical address stored in the write command is not equal to any of the logical addresses of the storage areas, the data contained in the write command is written into a storage area at the end of the existing file data. For example, the file B is written into a storage area subsequent to the end of the file A, as shown in FIG. 8.

If the logical address stored in the write command is equal to one of the logical addresses in the storage areas, the data invalidating unit 23 assigns the erasable data indicating flag to data stored in the storage area specified by the logical address in the write command. Then, the data contained in the write command is written into the storage area subsequent to the end of the existing file. At this time, the data stored in the storage area specified by the logical address contained in the write command is not erased. In the case shown in FIG. 8, the file A becomes invalid data, and a file A' (updated version of the file A) is written into the storage area subsequent to the end of the file A under the control of the file writing unit 24. In practice, the file writing unit 24 executes a verification process for determining whether or not the storage area into which data is to be written is defective. If it is determined that the storage area is defective, a failure flag is written into the attribute management field, and the storage area is inhibited from being used.

By repeatedly executing the above operation, the entire storage area is filled with data. At this time, the erasable file is actually erased, and the file arrangement unit 25 executes the file arrangement operation. When a flash memory chip of a type in which data stored therein is erased all at once, it is necessary to use at least one flash memory chip in order to form the file arrangement memory area FM. With a flash memory chip of a type in which data can be erased for each block, it is necessary to provide a storage area equal to one block. Hence, the storage capacity of the IC memory card 10 is equal to (the total storage capacity of the IC memory card 10)–(one chip (one block)).

In order to have the chips or blocks equally used, the file arrangement unit 25 operates as follows. The operation of the file arrangement unit 25 will be described with reference to FIG. 9. In the following operation, the file arrangement memory area corresponds to one chip. The file arrangement unit 25 selects the chip having the largest number of flags indicating erasable data (step 100), and writes valid data stored in the selected chip into the file arrangement chip (step 101). Then, the file arrangement unit 25 erases data from the selected chip all at once (step 102). The selected chip functions as the file arrangement chip from then on. The management unit 21 refers to information indicating the number of times that programming of the chips has been performed, and selects the smallest number of times that programming has been performed and the largest number of times that programming has been performed. In FIG. 8, the chip #1 (labeled LM) has the largest number of times, and the chip #3 (labeled SM) has the smallest number of times. Then, the management unit 21 determines whether or not the difference between the largest number of times and the smallest number of times is greater than a threshold value (step 103).

Figure 9:
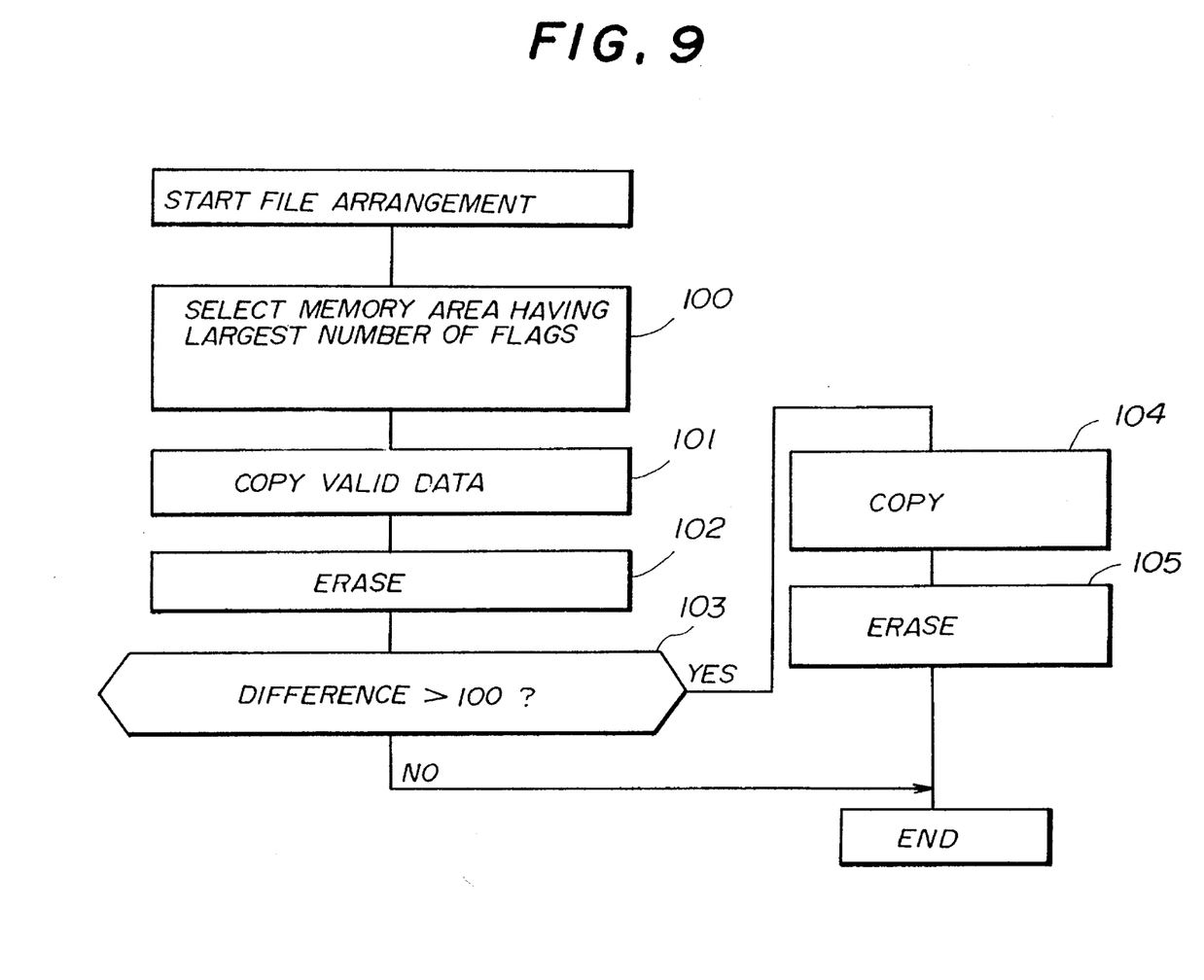
FIG. 9 is a flowchart showing the operation of the embodiment of the present invention.

When the result of the step 103 determination is NO, the arrangement process shown in FIG. 9 is ended. When the result of the step 103 determination is YES, data stored in the chip (SM in FIG. 8) having the smallest number of times that programming has been carried out is copied and written into the file arrangement chip (step 104), and is then erased therefrom (step 105). In this manner, the above chip starts to function as the file arrangement chip.

For example, the threshold value is 100 (equal to 1% of the allowable number of times that programming (erasing) may be carried out.

The present invention is not limited to the specifically disclosed embodiments, and variations and modifications may be made without departing from the scope of the present invention.

What is claimed is:

1. A data management system for a programming-limited type semiconductor memory which is programmable a limited number of times and which includes a plurality of storage areas, the data management system comprising:

management means for managing, for each of the storage areas, a number of times that programming has been performed; and control means, coupled to said management means, for selecting one of the storage areas for which programming has been performed a smallest number of times and for having input data written into a selected one of the storage areas, wherein said control means comprises first means for saving data stored in the selected one of the storage areas for which programming has been performed the smallest number of times into one of the storage areas for which programming has been performed a largest number of times.

2. The data management system as claimed in claim 1, wherein said control means comprises second means for saving only valid data stored in the selected one of the storage areas for which programming has been performed the smallest number of times into an another one of the storage areas.

3. The data management system as claimed in claim 2, wherein said control means comprises third means for saving only valid data stored in the selected one of the storage areas for which programming has been performed the smallest number of times into said one of the storage areas for which programming has been performed the largest number of times.

4. The data management system as claimed in claim 1, wherein the storage areas are provided by respective semiconductor memory chips.

5. The data management system as claimed in claim 1, wherein the storage areas correspond to a plurality of blocks obtained by dividing an entire storage area of a single semiconductor memory chip.

6. The data management system as claimed in claimed 1, wherein said control means comprises second means, coupled to said management means, for calculating a difference between the largest number of times that programming has been carried out and the smallest number of times that programming has been carried out and for selecting a different one of the storage areas when the difference is greater than a threshold value.

7. The data management system as claimed in claim 6, wherein said control means further comprises:

third means for assigning a flag to each piece of erasable data;

fourth means, coupled to said third means, for selecting one of the storage areas which has a largest number of flags respectively assigned to pieces of erasable data;

fifth means, coupled to said third and fourth means, for saving valid data stored in the selected one of the storage areas which has the largest number of flags into another one of the storage areas; and sixth means, coupled to said third and fifth means, for erasing the erasable data from the selected one of the storage areas once, wherein said third, fourth and fifth and sixth means operate when the difference is equal to or less than the threshold value.

8. An IC memory card comprising:

a programming-limited type semiconductor memory which is programmable by a limited number of times and which includes a plurality of storage areas;

management means for managing, for each of the storage areas, a number of times that programming has been performed; and control means, coupled to said management means, for selecting one of the storage areas for which programming has been performed a smallest number of times and for having input data written into a selected one of the storage areas, wherein said control means comprises first means for saving data stored into the selected one of the storage areas for which programming has been performed the smallest number of times into one of the storage areas for which programming has been performed a largest number of times.

9. The IC memory card as claimed in claim 8, wherein said control means comprises second means for saving only valid data stored in the selected one of the storage areas for which programming has been performed the smallest number of times into an another one of the storage areas.

10. The IC memory card as claimed in claim 9, wherein said control means comprises third means for saving only valid data stored in the selected one of the storage areas for which programming has been performed the smallest number of times into said one of the storage areas for which programming has been performed the largest number of times.

11. The IC memory card as claimed in claim 8, wherein the storage areas are provided by respective semiconductor memory chips.

12. The IC memory card as claimed in claim 8, wherein the storage areas correspond to a plurality of blocks obtained by dividing an entire storage area of a single semiconductor memory chip.

13. The IC memory card as claimed in claim 8, wherein said control means comprises second means, coupled to said management means, for calculating a difference between the largest number of times that programming has been carried out and the smallest number of times that programming has been carried out and for selecting a different one of the storage areas when the difference is greater than a threshold value.

14. The IC memory card as claimed in claim 13, wherein said control means comprises:

third means for assigning a flag to each piece of erasable data;

fourth means, coupled to said third means, for selecting one of the storage areas which has a largest number of flags respectively assigned to pieces of erasable data;

fifth means, coupled to said third and fourth means, for saving valid data stored in the selected one of the storage areas which has the largest number of flags into another one of the storage areas; and     sixth means, coupled to said third and fifth means, for erasing the erasable data from the selected one of the storage areas once, wherein said third, fourth, fifth and sixth means operate when the difference is equal to or less than the threshold value.

* * * * *